United States Patent [19]

Hsu et al.

[11] Patent Number: 5,705,320
[45] Date of Patent: Jan. 6, 1998

[54] RECOVERY OF ALIGNMENT MARKS AND LASER MARKS AFTER CHEMICAL-MECHANICAL-POLISHING

[75] Inventors: Shun-Liang Hsu; Shih-Shiung Chen, both of Hsin-Chu, Taiwan

[73] Assignee: Taiwan Semiconductor Manufacturing Company, Ltd., Hsin-Chu, Taiwan

[21] Appl. No.: 747,502

[22] Filed: Nov. 12, 1996

[51] Int. Cl.$^6$ ................................. G03F 7/22; G03F 9/00
[52] U.S. Cl. ........................ 430/313; 430/5; 430/317; 430/394; 430/396; 438/712
[58] Field of Search ...................... 430/5, 313, 317, 430/394, 396; 438/689, 712

[56] References Cited

U.S. PATENT DOCUMENTS

| | | | |
|---|---|---|---|
| 3,402,110 | 9/1968 | Scherrer | 430/5 X |
| 5,401,691 | 3/1995 | Caldwell | 437/228 |
| 5,403,684 | 4/1995 | Schroeder et al. | 430/5 |

*Primary Examiner*—George F. Lesmes
*Assistant Examiner*—Bernard P. Codd
*Attorney, Agent, or Firm*—George O. Saile; Stephen B. Ackerman

[57] ABSTRACT

The preservation of alignment marks and identification marks throughout the multitude of processing steps employed for the manufacture of integrated circuit chips often requires the inclusion of additional operations which impact production cost and product throughput. Current increased utilization of global planarization operations such as chemical-mechanical-polishing have forced the inclusion of additional window opening lithographic steps requiring additional masks and etch operations to keep these marks from being obscured. This invention provides a technique and a reticle design for clearing and preserving alignment and wafer identification marks through planarization and metallization levels with improved throughput and without the need for additional reticles to clear the marks. The alignment mark areas are exposed by a large clear-out window located in the frame area of the contact/via reticle while the wafer identification marks are accommodated in the same fashion by the metal pattern reticle. The lithography for integrated circuit pattern exposure and the window exposure is accomplished by a single stepper pass at each level.

12 Claims, 8 Drawing Sheets

RECOVERY OF ALIGNMENT MARKS AND LASER MARKS AFTER CHEMICAL-MECHANICAL-POLISHING

BACKGROUND OF THE INVENTION

(1) Field of the Invention

The invention relates to processes for the manufacture of semiconductor devices and more particularly to processes related to the alignment marks and laser marks on semiconductor wafers.

(2) Description of prior art

The fabrication of integrated circuits not only involves the forming of semiconductor devices within the surface of a semiconductor wafer but also the creation of a complex network of wiring interconnections which comprise the electrical circuitry of the completed chip. These interconnections are accomplished by the alternate deposition of thin layers of conductive and insulating materials over the semiconductor devices. Each conductive layer is patterned by photolithographic techniques to form the wiring design for that level. This patterning process produces a surface with topological features, which, if no steps were taken, would replicate itself in each succeeding layer.

Conductive layers are usually metals such as aluminum, are deposited by physical-vapor-deposition(PVD) techniques such as vacuum evaporation or sputtering. These methods do not provide conformal coverage and the presence of topological features on the surface onto which they are deposited result in non-uniformities in thickness and other problems related to the shadowing effects of non-planar surfaces.

Frequently two to four levels of interconnection metallurgy are required to form the required circuits. In order to provide a planar surface for each level of metal, various methods have been used to globally planarize the insulator surface. Unfortunately, global planarization also removes the topographic features of alignment marks and laser identification marks. Unless these marks are re-opened in the insulator layer, the subsequently applied metallization layer would totally obscure them.

Alignment marks typically consist of one or more etched lines either in the saw kerf region of the wafer or within designated alignment mark die sites. Photolithographic steppers, used to pattern images onto the wafer, require these marks for alignment with a preceding pattern. The stepper aligns itself to these marks by sensing their step edges.

Laser marks are typically embedded into the substrate at the very beginning of processing. They contain information for later identification such as lot number and job number. These marks, although not required for mask to mask alignment, must nevertheless be kept visible during wafer processing. For some product designs, the laser marks are located in the saw kerf adjacent to the integrated circuit dice. In this way they may reflect not only wafer and lot number but can also indicate die location on the wafer. In other designs only one set of laser marks are provided on each wafer. These are typically located in a region where integrated circuit dice cannot be placed.

FIG. 1 shows the top view of a wafer layout. Integrated circuit dice 12 occupy most of the available sites on the wafer 10. The dice are patterned using conventional photolithographic techniques wherein a photoresist layer is exposed by a stepper. A photomask, called a reticle, contains the image of a single die. The wafer is mounted on a programmable x-y stage and the photoresist is exposed, one die at a time, by stepping each die site into position under the projected image. In the example wafer layout shown in FIG. 1, two die locations 14 have been allocated to contain alignment marks 16 which the stepper uses to align itself to the pattern.

The alignment marks are formed on the wafer at the first photolithographic processing level and are propagated throughout the process so that each successive photo image is aligned to a preceding one. The stepper senses the alignment marks 16 located in die fields 14 and adjusts the location of the wafer to place the first integrated circuit die in correct position. It then proceeds to sequentially expose the photoresist at each die location to the reticle image by indexing the wafer from one location to the next until all of the dice have been exposed. Periodically, the stepper may refer to the alignment marks to verify its alignment.

As can be seen in FIG. 1, there are numerous locations on the wafer which cannot be used for die formation. These occur at the edges of the wafer and along the flat region 18. The laser identification marks in this example are located in a region 20 along the wafer flat.

The newly developed planarization techniques such as chemical-mechanical-polishing(CMP) and sacrificial resist planarization have received widespread acceptance in the semiconductor fabrication industry. These methods of providing a planar surface upon which to build each successive layer of metallization have been welcomed because the problems associated with metal edge coverage and non-conformality have been greatly reduced. Unfortunately, whereas metallization uniformity has been improved, the flat featureless surface introduces new concerns, particularly after a blanket metal layer is deposited on it.

To illustrate this, the reader is referred to FIG. 2A where there is shown a cross section of a wafer 10 at the alignment mark region having an inter-metal-dielectric(IMD) layer 30 which has been planarized to a flat surface by CMP. The alignment marks are indicated by the topographic features 32. Via or contact openings are then formed in the IMD layer 30 over the integrated circuit dice. Alignment of the contact/via reticle is possible because the alignment marks are still visible to the stepper through the transparent IMD layer 30. However, if the alignment marks are not cleared of IMD layer 30 prior to the deposition of the next metal layer 34 as shown in FIG. 2B, the alignment marks become completely obscured by the metal and are not available for alignment of the metal pattern. Likewise, if laser identification marks are not cleared of metal deposited over a planarized surface they also vanish permanently. It is therefore essential that the IMD be cleared from the alignment mark areas and the metal layer from laser mark areas.

For the wafer layout shown in FIG. 1, clearing the IMD from the alignment mark and laser mark regions typically requires a separate reticle. The standard clear-out window reticle provided for the ASM stepper measures 1.6 mm×1.6 mm. The ASM stepper is manufactured by ASM lithography Inc. 2315 W. Fairmont Drive, Tempe Ariz. 85282 (USA). This reticle window is too small to be practical for clearing out either the alignment mark area or the laser mark area. The ASM clear-out window requires many exposures to properly cover these areas, slowing down wafer throughput, as well as taxing the steppers software capability. In addition, previous art methods require interchanging integrated circuit reticles with the separate ASM clear-out reticle in order to expose the alignment mark and laser mark regions.

Caldwell U.S. Pat. No. 5,401,691 describes the fabrication of an inverse open frame alignment mark. This single small mark is centrally located within a blank die and is surrounded by a region which is made lower than the mark area and the adjacent integrated circuit dice in order to prevent CMP polishing rate variations (high mesa effect) which affect IC dice neighboring the alignment mark die. Lowering of this region is accomplished by using additional reticles to mask growth of field oxide and remove polysilicon layers in this region.

In dealing with restoring the alignment mark after CMP, Caldwell utilizes an additional open frame reticle to clear the alignment mark area during the contact or via etch. Caldwell does not address the problem of recovery of wafer identification marks after CMP.

SUMMARY OF THE INVENTION

It is an object of this invention to relate an improved design for a clear out window which is incorporated into the frame area of a photolithographic stepper reticle. Although the clear-out window as described by this invention may be placed on any stepper reticle, its application, as recited here, is directed at the preservation of alignment marks and wafer identification marks which would otherwise be lost during processing. The first reticles which require the use of a clear-out window are those which pattern via openings and contact openings. The use of this window permits the recovery of alignment marks covered by IMD layers, in particular, IMD layers which have undergone CMP or other forms of planarization.

In a second application the clear-out window is incorporated on a reticle which patterns interconnection metallization. This window permits the metal over laser identification marks to be etched away, keeping the identification marks visible.

The increased size and improved utilization of the novel clear-out window permits a reduction of better than 60% reduction in the number of exposures required to properly open alignment marks and about a 75% reduction in the number of exposures required to recover the alignment marks and laser identification marks.

It is a further object of this invention to eliminate the need to exchange reticles during stepper operation for the purpose of using clear-out windows. This object is achieved by placing the novel clear-out window on the same reticle which contain the integrated circuit pattern.

Incorporation of the novel clear-out window increases the overall stepper throughput by about 13%. This is accomplished primarily by reducing the total number of exposures required to expose the wafer.

An optimum size for the alignment mark opening in the IMD layer is about 3.5 mm×3.5 mm. Dimensions greater than this can lead to over-polishing in the alignment mark window by the CMP causing a dishing effect. This can result in damaged alignment marks. For openings smaller than 3.5 mm×3.5 mm the IMD layer over the alignment marks is polished flat, and the alignment marks are not disfigured. The alignment mark window recited by this invention is 3.5 mm×1.6 mm which fits well into the frame area and requires only three exposures to expose sufficient photoresist area over alignment marks. The 1.6 mm×1.6 mm ASM window requires nine exposures to cover the same area.

DESCRIPTION OF THE PREFERRED EMBODIMENTS

Accordingly, there is given, a first embodiment wherein processing steps are described encompassing the formation of contacts openings on a semiconductor wafer having devices formed within its surface. The embodiment employs a photolithographic patterning step in which a novel clear-out window is used to recover alignment marks. Since wafer processing procedures such as layer deposition, etching, and planarization are well known in the art, they will not be described in close detail. Only the steps involving utilization of the novel clear-out window will be thusly recited.

Figure 3:
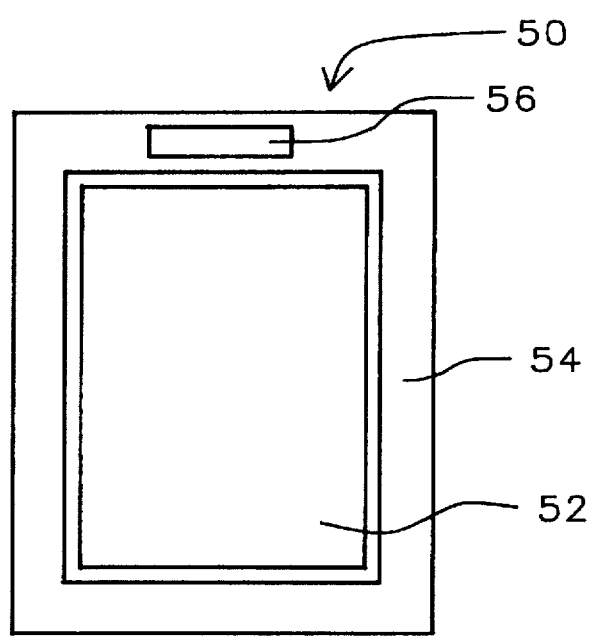
FIG. 3 is a top view of a reticle used to pattern contacts or vias and having a window for clearing IMD from alignment marks as taught by this invention.

Referring to FIG. 3, there is shown a reticle 50 for a stepper which contains an image of the pattern for integrated circuit contact openings in the area 52. Located in the frame area 54, is a window 56 with dimensions of about 3.5 mm×1.6 mm.

A silicon wafer having integrated circuit devices formed within its surface is provided. The integrated circuit being formed on the wafer is patterned using a photolithographic stepper according to the layout shown in FIG. 1. Topographic alignment marks are located in regions 16 in die fields 14 and laser identification marks are found in the region 20 near the flat 18.

Figure 1:
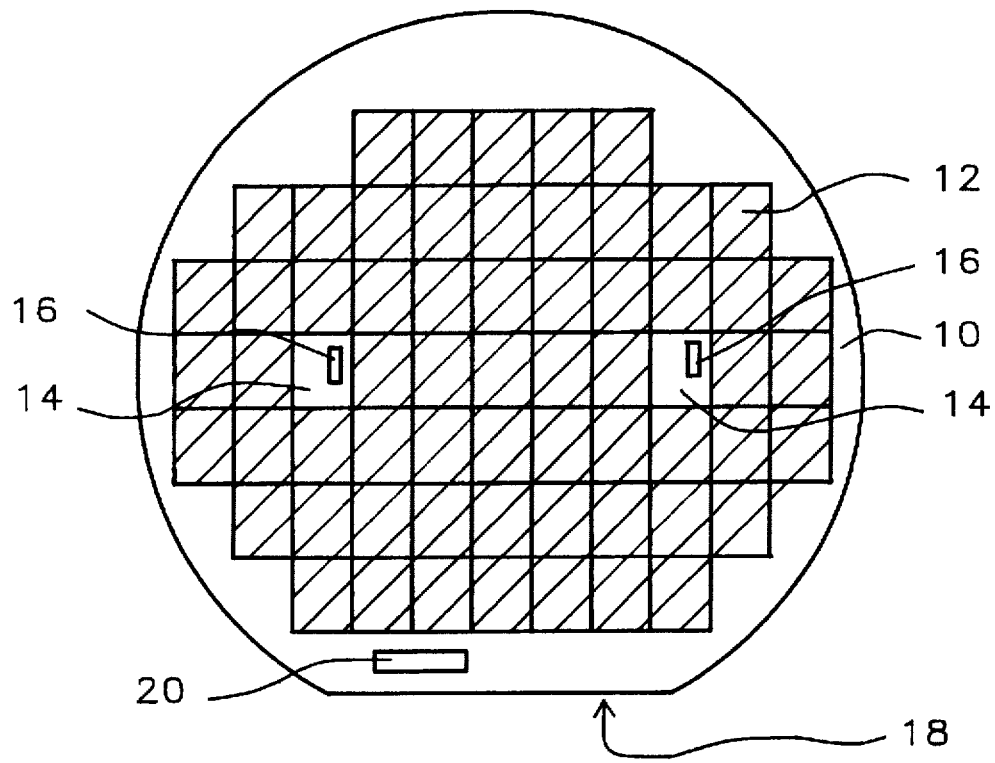
FIG. 1 is a top view of a typical wafer layout showing the locations of integrated circuit dice, alignment marks, and laser identification marks.
Figure 2A:
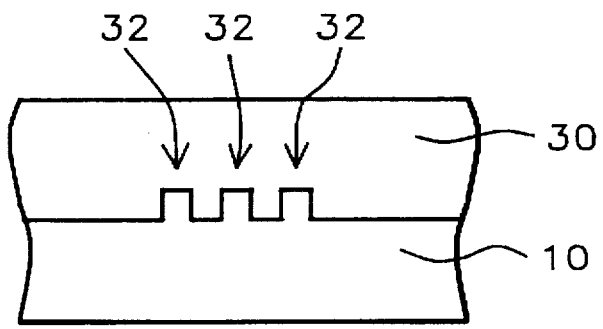
FIG. 2A and FIG. 2B are cross sections of alignment marks during processing wherein CMP is used to planarize an IMD layer.
Figure 2B:
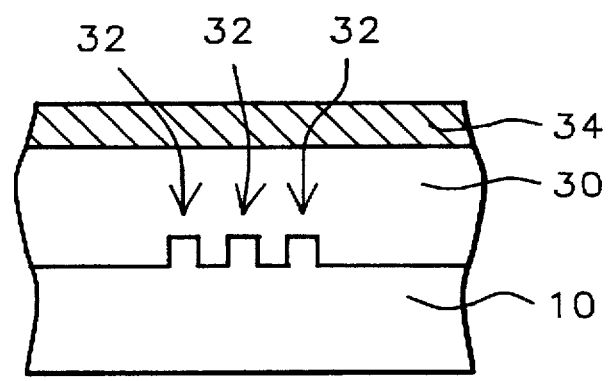
Figure 4A:
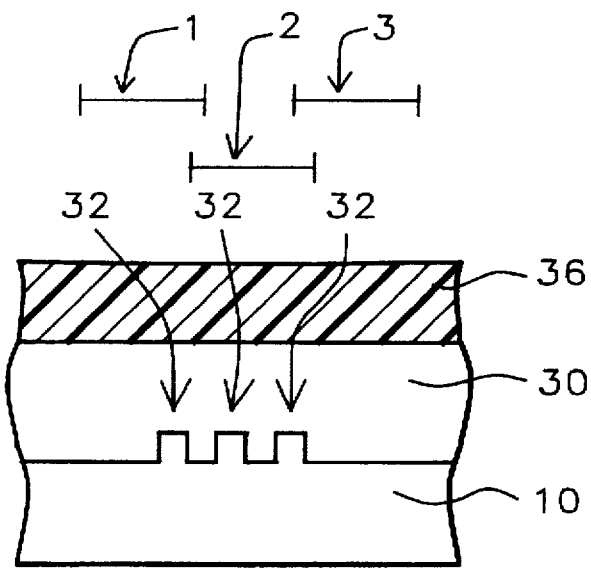
FIG. 4A through FIG. 4C are cross sections of alignment marks showing the steps used to recover them before metal lithography.

Referring to FIG. 4A there is shown a cross section of the alignment mark region 16 of FIG. 1. The alignment marks 32, at the point of introduction of this embodiment, have been covered with an insulative layer 30. This is the layer through which contact openings are to be opened to subjacent active regions of the semiconductor devices in integrated circuit dice. The upper surface of the insulative layer has been planarized using CMP. A layer of photoresist 36 is applied over the wafer and the wafer is mounted on the programmable stage of a stepper.

The stepper senses the edges of the alignment marks 32 through the transparent insulative layer 30 and aligns the stage to position a first die in the focus of the reticle 50. After exposing the resist over the die to the contacts image, the stepper proceeds to expose the dice in a programmed sequence. When an alignment mark die 14 (FIG. 1) is reached, the stepper exposes the resist over the 3.5 mm×3.5 mm alignment mark region 16 by making three successive overlapping exposures through the clear-out window 56. During these exposures, four programmable mask blades located within the stepper restrict the exposing radiation to pass only through the clear-out window 56 preventing exposure from other portions of the reticle 50.

Figure 5:
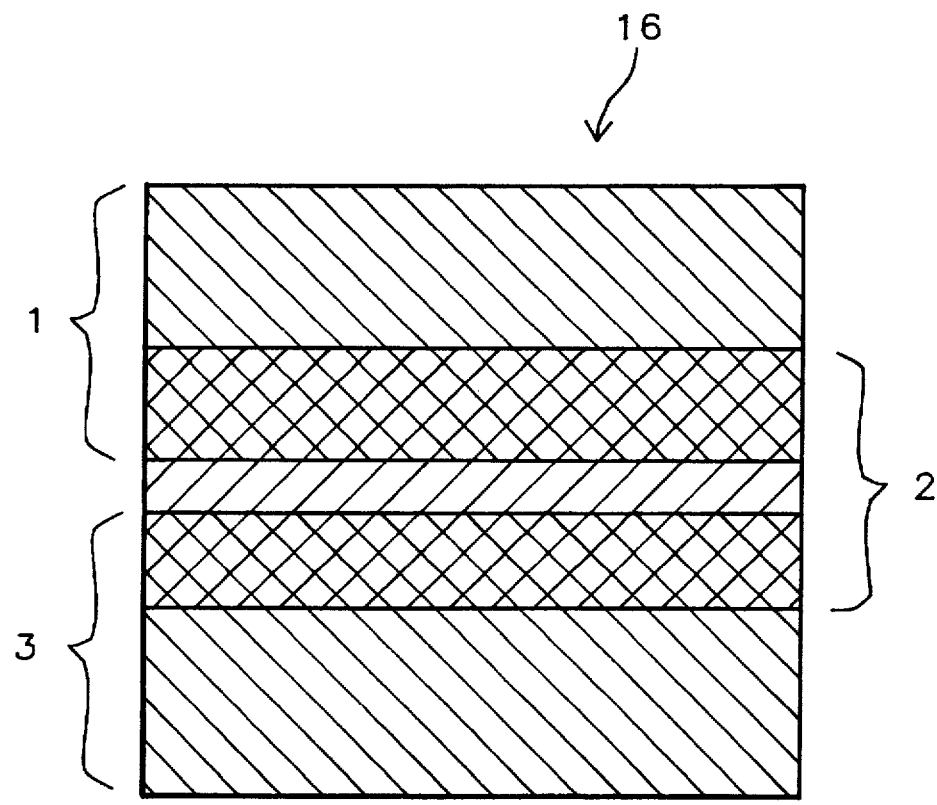
FIG. 5 shows a sequence of exposures of photoresist over an region containing alignment marks using a reticle containing a clear-out window as taught by this invention.

FIG. 5. Illustrates a sequence for the three overlapping exposures 1,2 and 3 of the 3.5 mm×1.6 mm window 56 to cover the 3.5×3.5 mm alignment mark region 16. The exposures 1, 2 and 3 are also shown in FIG. 4A. The stepper then continues to successively step and expose the integrated circuit dice 12 until it reaches the second alignment mark site 14 whereupon it repeats the multiple exposure step to open the second alignment mark window. Finally, the remainder of the integrated circuit dice are exposed and the wafer is dismounted.

Figure 4B:
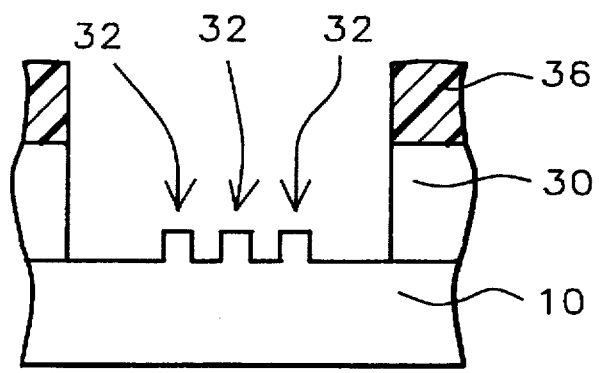

The photoresist 36 is developed and the patterned contacts are opened by reactive-ion-etching(RIE). The insulative layer over the alignment marks is also remove by the RIE exposing their topography and is shown in FIG. 4B.

Figure 4C:
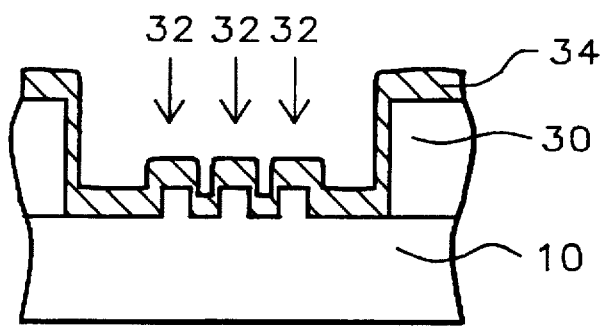

Referring now to FIG. 4C a metal layer 34 is deposited over the wafer This layer replicates the topography of the alignment marks 32 making them usable by the steppers alignment sensor during the subsequent metal patterning.

In a second embodiment a reticle of the same design as that of the first embodiment is used to recover the laser marks in the region 20 of FIG. 1. Here the laser marks are obscured by a metal layer deposited over the IMD layer. The metal layer is to be patterned to form a first layer of interconnection wiring on the integrated circuit dice. It must be removed from over the laser mark region 20 to reveal the laser marks.

Figure 6:
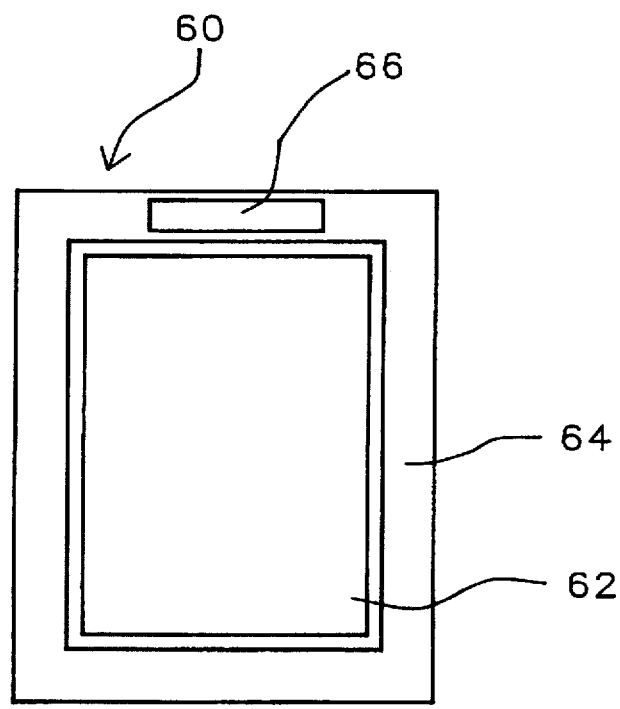
FIG. 6 is a top view of a reticle used to pattern a metallization layer and having a window to remove a metal layer over laser marks as taught by this invention.

For this photolithographic step, the reticle 60 shown in FIG. 6 is used by the stepper. The reticle 60 contains the image of the metallization pattern of the integrated circuit die in the area 62. In addition the clear-out window 66 is provided in the upper section of the frame 64. The clear-out window 66 is identical to that shown in FIG. 3 having dimensions of 3.5 mm×1.6 mm but will now be used to exposed the photoresist over the laser identification marks 20.

Figure 7A:
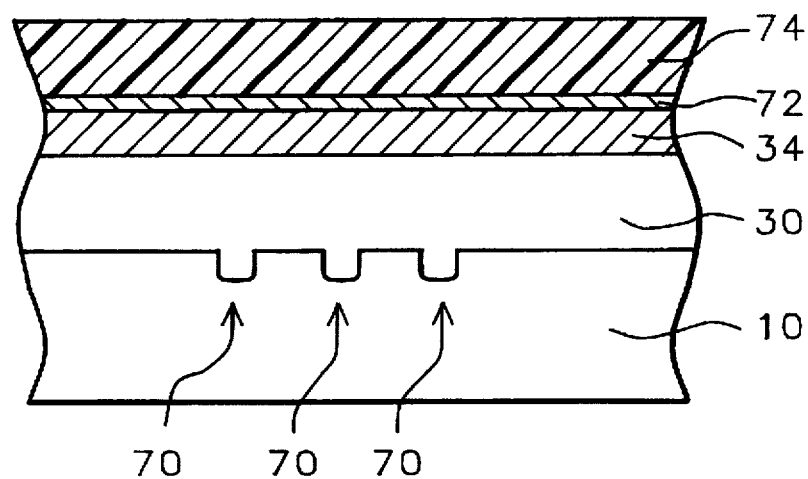
FIG. 7A through FIG. 7C are cross sections showing laser marks obscured by a metal layer and the steps used to recover them during patterning of the metal layer.

Referring now to FIG. 7A, the laser identification marks 70 are shown obscured from top view by the metal layer 34. An anti-reflective-coating 72 is applied over the metal layer followed by a layer of photoresist 74. As in the previous photolithographic step, the wafer 10 is mounted on the stepper stage and the stepper aligns to the first integrated circuit die in the exposure sequence using the alignment marks 16(FIG. 1) which were recovered by the steps of the first embodiment. Sequential exposures of the integrated circuit dice 12 proceeds until all have been exposed with the pattern 62 of the reticle 60. The alignment mark sites 14 are skipped. The stepper then proceeds to expose the resist in the region of the laser identification marks 20 by performing multiple exposures of the window 66 over this area. Only four exposures are made using the reticle 60 whereas 18 were required with the ASM clear-out window.

Figure 8:
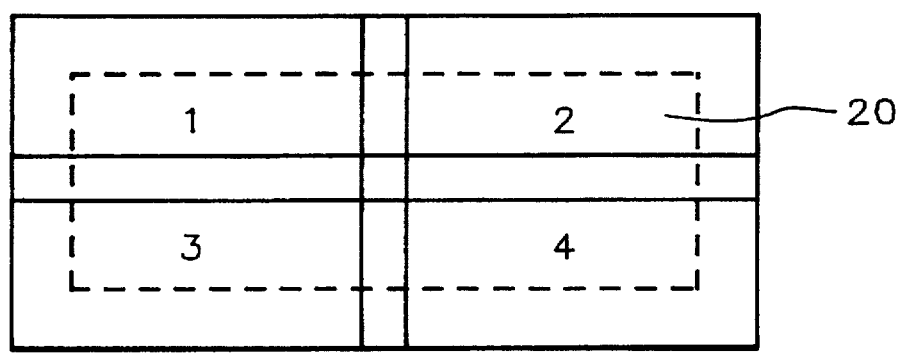
FIG. 8 shows a sequence of exposures of photoresist over a region containing laser identification marks using a reticle with a clear-out window as taught by this invention.

FIG. 8 shows the positions of a sequence 1,2,3, and 4 of overlapping exposures used to expose the laser mark region 20. During these exposures, programmable mask blades surround the clear-out window 66 preventing exposure of the photoresist by other portions of the reticle 60.

Figure 7B:
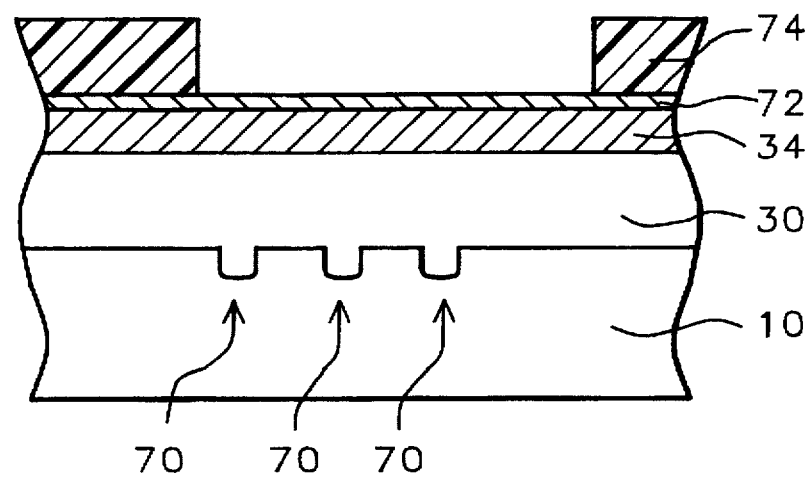
Figure 7C:
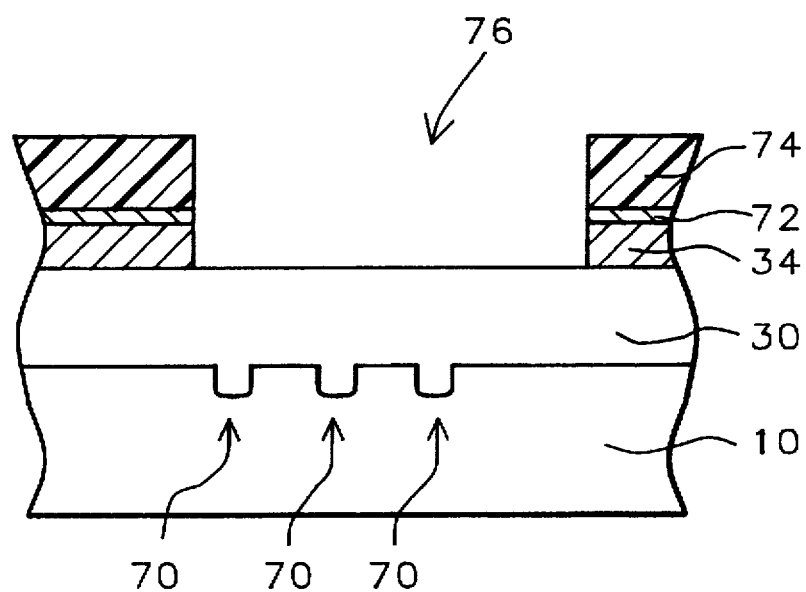

The cross section in FIG. 7B shows the developed photoresist, forming the etch mask for the metallization layer 34. Continuing to FIG. 7C, the metal pattern is etched and the photoresist layer 74 removed, leaving the metal wiring pattern over the integrated circuit dice and an opening 76 over the laser identification marks through which they can again be seen.

The first and second embodiments of this invention utilize novel stepper reticles to restore alignment marks and laser identification marks which were jeopardized by surface planarization occurring during contact opening and first metallization.

In applications using contact or via plugs, for example tungsten plugs, the alignment mark topology is not lost because the dimensions of the alignment marks are much larger than those of the plugs. After tungsten etch-back, whereby the isolated tungsten plugs are formed, the bases of the alignment marks, being much broader than the bases of the tungsten plugs are cleared of tungsten as well, leaving the topology of the alignment marks intact.

The procedure and reticle usage described in the first and second embodiments can be applied to the same extent to the processing steps involving vias and higher levels of metallization. Moreover, the need for recovery of alignment marks at levels involving vias is greater because CMP and other forms of global planarization are practiced to a greater extent at these levels.

A third embodiment is now recited wherein the contact reticle of the first embodiment is replaced by a reticle which contains the image of via openings in the region 52(of FIG. 3) for the integrated circuit through which successive layers of metallization are interconnected. The procedures and clear-out window layouts on the reticles are identical to those of the first embodiment.

Figure 9A:
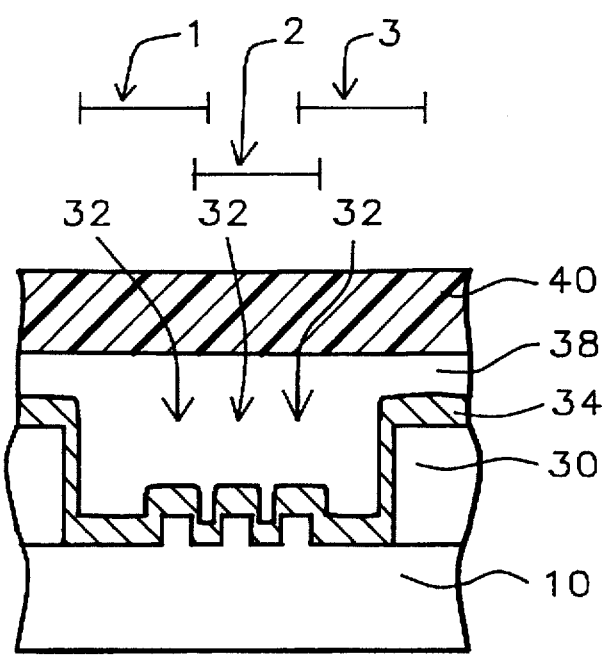
FIG. 9A through FIG. 9C are cross sections of the alignment marks illustrating their propagation from one level of interconnection metallization to the next.
Figure 9B:
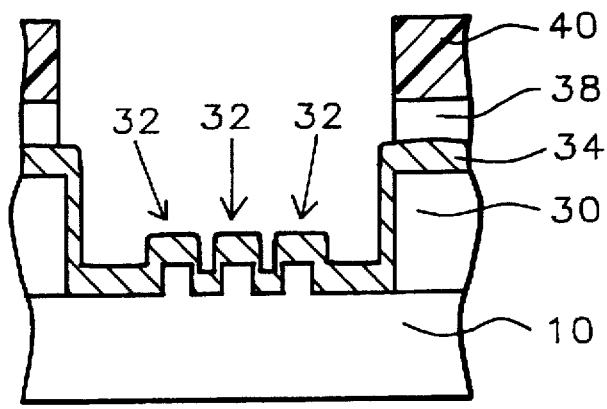

FIG. 9A shows a cross section of the alignment mark region corresponding to that shown in FIG. 4C. A second IMD layer 38 has been deposited over the first metal pattern 34. The as deposited IMD layer 38 left topographic features over the first metal circuitry which were removed by CMP or by another method of global planarization. The photoresist for the via openings 40 has been applied and the stepper exposure sequence outlined in the first embodiment is accomplished. The three exposures of the of the clear-out window are again shown in the figure as 1, 2, and 3. After resist development and RIE, the alignment marks 32 are cleared of IMD as shown in FIG. 9B.

Figure 9C:
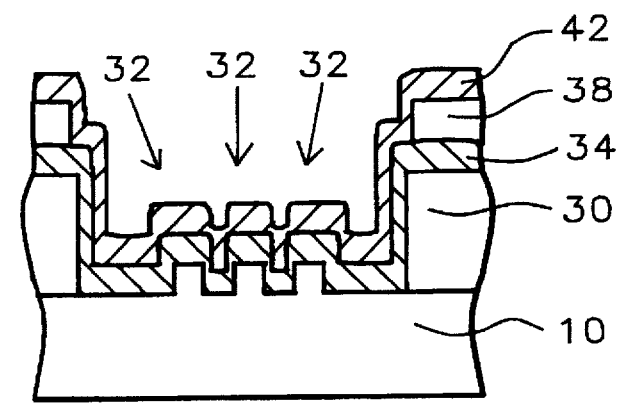

Following photoresist removal a second ARC layer(not shown) and metallization layer 42 are deposited as shown in FIG. 9C. The alignment marks 32 are now available for alignment of the second metallization reticle. This reticle has the same layout as the first metallization reticle 60 in FIG. 6 and contains the image for the second metallization layer of the integrated circuit in addition to the clear-out window 66. The stepper sequence and processing for this reticle is the same as that practiced in the second embodiment to clear away the metallization over the laser marks.

While this invention has been particularly shown and described with reference to the preferred embodiments thereof, it will be understood by those skilled in the art that various changes in form and details may be made without departing from the spirit and scope of the invention. Application of this invention to higher levels of metallization is an obvious extension of these embodiments.

What is claimed is:

1. A method for patterning a planarized insulative layer on a semiconductor wafer, said semiconductor wafer having a plurality of integrated circuit dice and a plurality of dice containing alignment marks, comprising:

(a) providing a semiconductor wafer having a plurality of integrated circuit dice and a plurality of dice containing alignment marks and having a planarized insulative layer over its surface;

(b) depositing a photoresist layer;

(c) mounting said semiconductor wafer on the stage of a stepper;

(d) mounting a reticle in said stepper, said reticle having a photolithographic image of an integrated circuit pattern enclosed within a rectangular frame region and a window in said frame region;

(e) aligning said semiconductor wafer to said alignment marks and exposing said photoresist layer over a first integrated circuit die with said photolithographic image;

(f) stepping and exposing said photoresist layer over said integrated circuit dice with said photolithographic image in sequence until a die containing said alignment marks is reached;

(h) making multiple overlapping exposures of said photoresist layer over said alignment marks through said window;

(l) repeating steps (f) through (h) until all said integrated circuit dice and all said dice containing alignment marks have been exposed;

(j) developing said photoresist layer; and (k) etching said insulative layer with a unidirectional etching technique, thereby exposing said alignment marks.

2. The method of claim 1 wherein said window is rectangular with dimensions of about 3.5 mm by 1.6 mm.

3. The method of claim 1 wherein said integrated circuit pattern comprises contacts openings.

4. The method of claim 1 wherein said integrated circuit pattern comprises via openings.

5. The method of claim 1 wherein programmable mask blades are employed by said stepper during the performance of step (h) to expose said photoresist layer only through said window.

6. The method of claim 1 wherein said unidirectional etching technique is reactive-ion-etching.

7. A method for patterning an opaque layer deposited over a semiconductor wafer, said semiconductor wafer having a plurality of integrated circuit dice, a plurality of dice containing alignment marks, and a peripheral region containing identification marks, comprising:

(a) providing a semiconductor wafer having a plurality of integrated circuit dice, a plurality of dice containing alignment marks, and a peripheral region containing identification marks and having an opaque layer formed over its surface;

(b) depositing a photoresist layer;

(c) mounting said semiconductor wafer on the stage of a stepper;

(d) mounting a reticle in said stepper, said reticle having a rectangular photolithographic image of an integrated circuit pattern surrounded by a rectangular frame region and a window within said frame region;

(e) aligning and exposing a first integrated circuit die on said semiconductor wafer to said photolithographic image;

(f) stepping and exposing successive integrated circuit dice to said photolithographic image in sequence, skipping dies containing alignment marks until all integrated circuit dice have been exposed;

(g) stepping to said peripheral region;

(h) making multiple overlapping exposures through said window until said photoresist layer over said identification marks is exposed;

(l) developing said photoresist layer; and (j) etching said opaque layer, thereby revealing said identification marks.

8. The method of claim 7 wherein said window is rectangular with dimensions of about 3.5 mm by 1.6 mm.

9. The method of claim 7 wherein said opaque layer is a metal.

10. The method of claim 7 wherein said integrated circuit pattern comprises interconnection metallization.

11. The method of claim 7 wherein programmable mask blades are employed by said stepper during the performance of step (h) to expose said photoresist layer only through said window.

12. The method of claim 7 wherein said peripheral region is located adjacent to the flat edge of said semiconductor wafer.

* * * * *